United States Patent [19]

Kim et al.

[11] Patent Number: 5,479,105
[45] Date of Patent: Dec. 26, 1995

[54] KNOWN-GOOD DIE TESTING APPARATUS

[75] Inventors: Il Ung Kim; Si Don Choi, both of Kyungki, Rep. of Korea

[73] Assignee: Samsung Electronics Co., Ltd., Suwon, Rep. of Korea

[21] Appl. No.: 266,533

[22] Filed: Jun. 27, 1994

[30] Foreign Application Priority Data

Jun. 25, 1993 [KR] Rep. of Korea ..................... 93-11670

[51] Int. Cl.[6] .................................................. G01R 31/02
[52] U.S. Cl. ................................... 324/755; 324/754
[58] Field of Search ................................. 324/755, 754; 439/71, 70

[56] References Cited

U.S. PATENT DOCUMENTS

| | | | |
|---|---|---|---|
| 4,329,642 | 5/1982 | Luthi | 324/755 |
| 4,644,269 | 2/1987 | Golder | 324/755 |
| 5,175,491 | 12/1992 | Ewers | 324/755 |
| 5,177,439 | 1/1993 | Liu | 324/755 |
| 5,180,974 | 1/1993 | Mitchell | 324/755 |

Primary Examiner—Kenneth A. Wieder
Assistant Examiner—Mark Wardas
Attorney, Agent, or Firm—Cushman Darby & Cushman

[57] ABSTRACT

A die testing apparatus according to the present invention includes a lead frame having a plurality of die pads, wherein a plurality of bare chips are mounted on the die pads. The bonding pads of each bare chips are connected to a plurality of leads associated with each die pad through a plurality of bonding wires. The die pads are supported by a plurality of tie bars and the leads are supported by an adhesion tape attached to the lead frame. The lead frame is placed in a test socket which includes an under socket having a plurality of slot grooves and an upper socket hinged with the under socket and having a plurality of slot holes and a plurality of test probes contacting the leads of the lead frame. The lead frame is fixed between the upper and under sockets by means of a plurality of pins penetrating the slot holes and guiding holes located at a periphery of the lead frame and then being inserted into the slot grooves, and one side of the lead frame is caught between the upper and under sockets by a clamp. The test socket has a plug portion with electrical contacts thereon, which is located at an edge of the socket so that it can be plugged into a testing board.

6 Claims, 4 Drawing Sheets

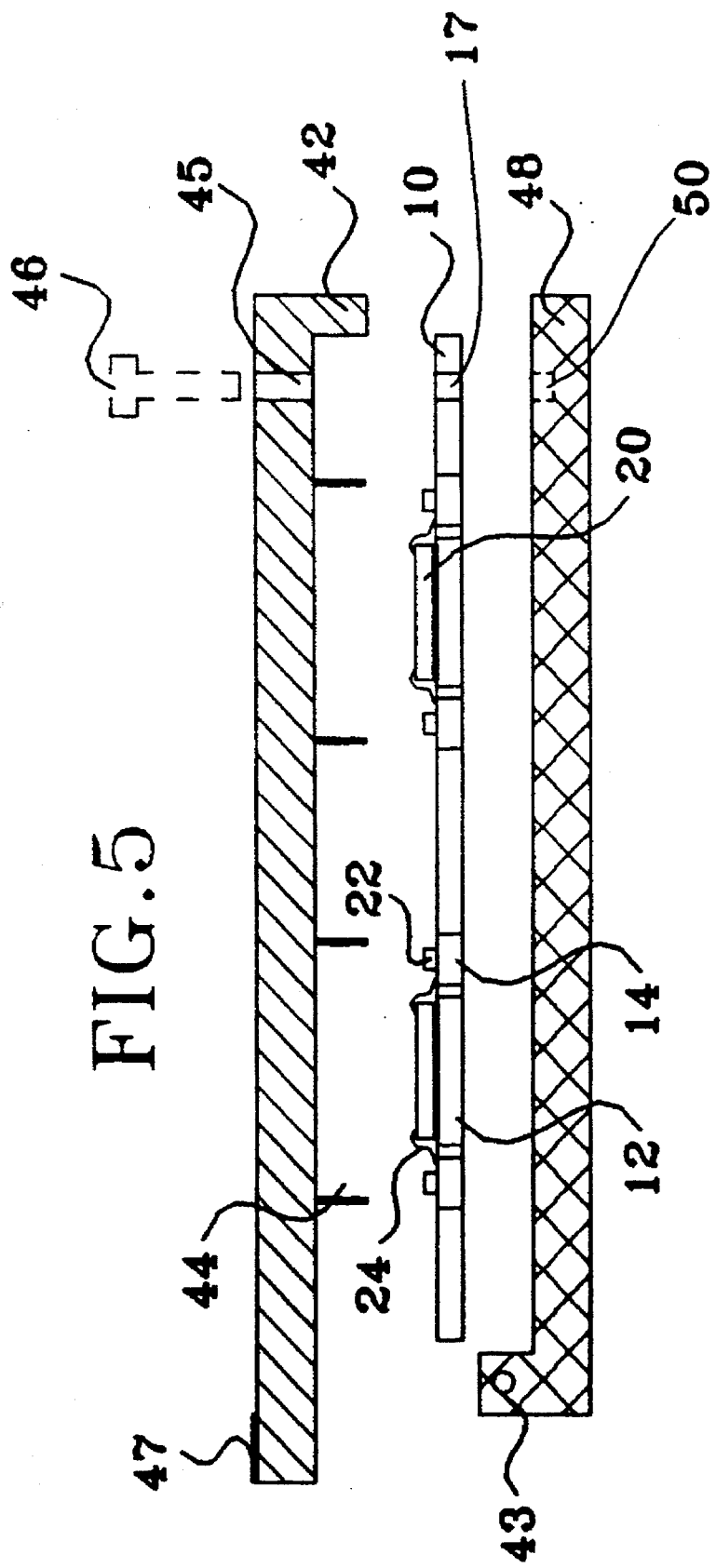

KNOWN-GOOD DIE TESTING APPARATUS

BACKGROUND OF THE INVENTION

1. Field of the Invention

The present invention relates to a test apparatus for testing integrated circuit chips and more particularly to a test socket for testing a plurality of bare chips to produce a plurality of known-good dies (hereinafter abbreviated to "KGD").

2. Description of the Prior Art

Standard integrated circuit chips, in general, are subjected to various tests in order to determine the reliability of the chips before distributing the chips for use. Briefly, there are two important reliability tests: one is an electrical characteristic test in which all input and output terminals are connected to a test signal generator to verify the transferring characteristics between the signals coming in and out at the terminals; and the other is a burn-in test in which a given chip is exposed to overstress conditions of higher than normal operating temperatures and voltages to verify its lifetime and to detect defects.

As an example, the burn-in test for a dynamic random access memory chip has been appreciated as a useful method to verify the reliability of memory circuit elements such as memory cells and signal lines. During the burn-in test, defects latent in a dynamic random access memory chip result in the destruction of gate oxide films of MOS transistors and shortening between multi-leveled conduction layers. These defective chips are abandoned as inferior and non-defective chips are selected instead. Since it is difficult to electrically connect a bare chip from a semiconductor wafer to the test signal generator, the tests are normally conducted by packaging the chip with external leads connected to chip pads, and inserting the external leads to a test socket, which is then mounted onto a test board. This, however, has disadvantages such as the waste of the costs for packaging a potentially inferior chip and the limitation for increasing the number of bare chips to be tested in one time.

Recently proposed and advanced integrated technologies employ a flip chip in which a plurality of bare chips are mounted on a ceramic board to yield faster operating speed, larger capacity, and integrating density than before. A multi-chip module (abbreviated to "MCM") is successfully being employed in a super computer system by several integrated circuit makers such as IBM, DEC and HITACHI with its own advantage of very large scale of integration rate. The MCM employs a plurality of chips placed onto ceramic boards including a high density arrangement of conduction lines. However, the very large scale of integration rate in the MCM technology is accompanied by technical and economical problems such as remarkably low yield, causing increased cost and decreased marketability. Though it is rigorously important to identify sufficient known-good dies (abbreviated to "KGD") of bare chips proved not to be defective, it is difficult to mass-produce the KGDs at a low cost because a single bare chip without external leads cannot be tested using the burn-in socket aforementioned or until the MCM package is mounted on a printing circuit board.

To overcome the problems described above, an apparatus is disclosed in U.S. Pat. No. 5,006,792 for providing a flip chip test socket adapter to perform the burn-in test with a bare chip, in which a plurality of solder bumps are formed on the bonding pads. The flip chip having the solder bumps on its bonding pads is inserted into the test socket adapter and is subjected to the burn-in test. The test socket adapter includes a substrate provided with cantilever beams, being accommodated within a case.

However, in the conventional test configuration, very expensive equipment must be provided to precisely form the solder bumps on the bonding pads of the IC chip because the pitches between the bonding pads are very narrow in the microscopic dimension. Furthermore, the test is performed on only one chip at a time in order to assure the reliability. Thus, the cost for one KGD may be increased and the test may not be advantageous for producing large number of the KGDs. Moreover, it is difficult to deal with single chip for an individual test of itself. In addition, the structure of the above-described socket adapter must be complicatedly changed to another configuration corresponding to another IC chip or the positions of the bumps.

SUMMARY OF THE INVENTION

Accordingly, it is an object of the invention to provide an apparatus for testing a plurality of bare chips at a low cost.

It is another object of the invention to provide a test apparatus for producing a plurality of KGDs, advantageously for manufacturing multi-chip modules or an ASIC modules at a low cost.

A known-good die testing apparatus according to the invention comprises a lead frame having a plurality of guiding holes, wherein a plurality of bare chips are mounted on a plurality of die pads and a plurality of bonding pads of the bare chips are electrically connected to a plurality of leads, the die pads being supported by a plurality of tie bars and the leads being supported by an adhesion tape adhered to the lead frame; an under socket having a plurality of slot grooves, on which the lead frame is mounted; and an upper socket and an under socket hinged with each other and having a plurality of slot holes and a plurality of test probe contacting the leads; whereby the lead frame is fixed between the upper and under sockets by means of a plurality of pins penetrating the slot holes and the guiding holes and then being inserted into the slot grooves, being fixed at its one side between the upper and under sockets by a clamp.

The foregoing and other objects, features and advantages of the invention will be apparent from the following and more particular description of the preferred embodiments of the invention, as illustrated in the accompanied drawings.

BRIEF DESCRIPTION OF THE DRAWING

FIG. 5 is a cross-sectional view of the test socket taken along the line V—V in FIG. 4.

DETAILED DESCRIPTION OF A PREFERRED EMBODIMENT

Figure 1:
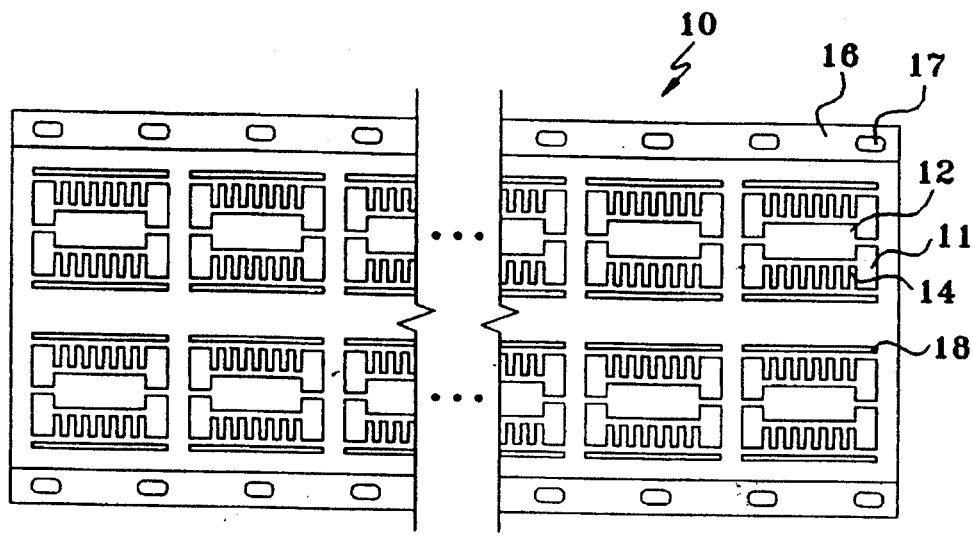
FIG. 1 is a top view of a lead frame with die pads, which is accommodated in a test socket according to the present invention.
Figure 2:
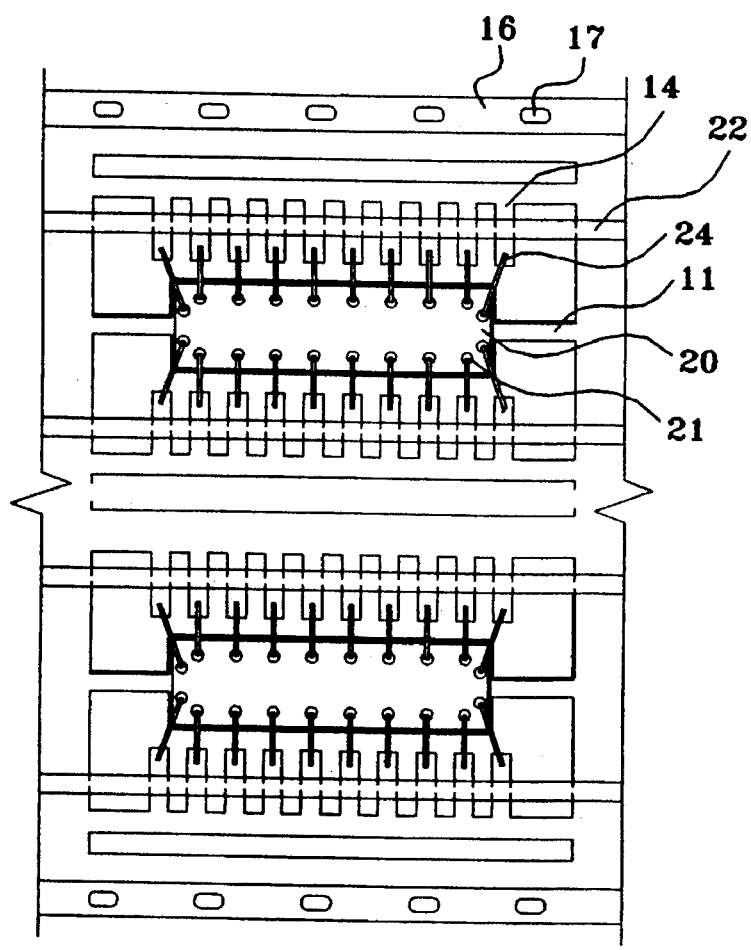
FIG. 2 is an enlarged top view of the lead frame of FIG. 1 including bare chips mounted on the die pads.
Figure 3:
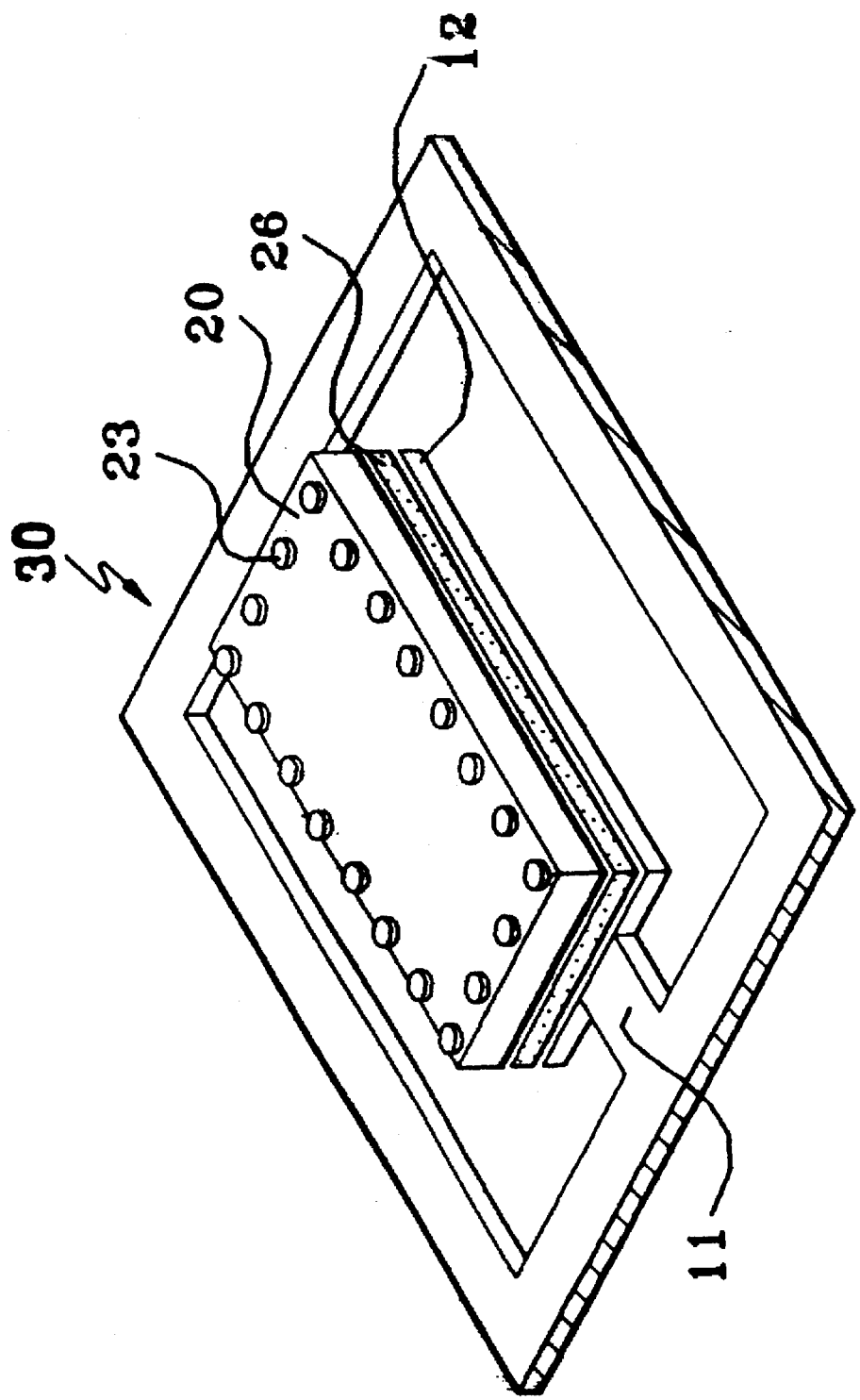
FIG. 3 is a perspective view illustrating one of a plurality of KGDs constructed in a KGD array completely produced.

FIG. 1 shows a configuration of a lead frame to be accommodated into a test socket according to the invention, in order to obtain a plurality of KGDs through a test process proposed in the commonly assigned U.S. application Ser. No. 08/224,020, the entire content of which is incorporated herein by reference. In FIG. 1, a plurality of die pads 12 are connected to a lead frame 10 supported by tie bars 11. A plurality of leads 14 are located adjacent to the periphery of die pads 12. Openings 18 defined between side rails 16 and leads 14 reduce the distortion of the leads 14 during trimming steps for removing the side rails 16. The lead frame 10 does not include dam bars for interconnecting the leads 14 as in the conventional lead frames. In order to fix the leads 14 to the lead frame 10, as shown in FIG. 2 and FIG. 3, poly-amide adhesion tapes 22 are attached on and across the leads 14. A plurality of chips 20 are attached on the die pads 12 by means of adhesion materials 26, so that bonding wires 24 connect the leads 14 to corresponding bonding pads 21 of the chips 20. Each group of the leads 14 belonging to one chip 20 is electrically isolated from the lead frame 10 through subsequent trimming steps, where the openings 18 facilitates the trimming steps (Refer to FIG. 2). Inferior chips are detected and noted while the electrical characteristic and burn-in tests are being conducted simultaneously against the plurality of the chips 20. Then, a KGD array 30 including a plurality of KGDs as shown in part in FIG. 3 is completed by removing the bonding wires 24, the leads 14, and the adhesion tapes 22, and leaving the tie bars 11. The remaining connection portions 23 may be used as chip bumps, and the inferior chips are removed with their corresponding die pads by means of a trimming tool. A customer can separate each KGD from the KGD array by cutting the tie bars 11 to use it individually. Each KGD separated from the array regardless of its attachment to the die pad may be used for making an wire-bonded chip or a flip chip in accordance with the customer's desire. More descriptions about the usages and effects relevant to the produced KGD array are provided in the formerly filed specification.

It should be noted that the present invention is directed to a test socket useful for producing a plurality of KGDs, and not to the structures of the lead frame and KGD array.

Figure 4:
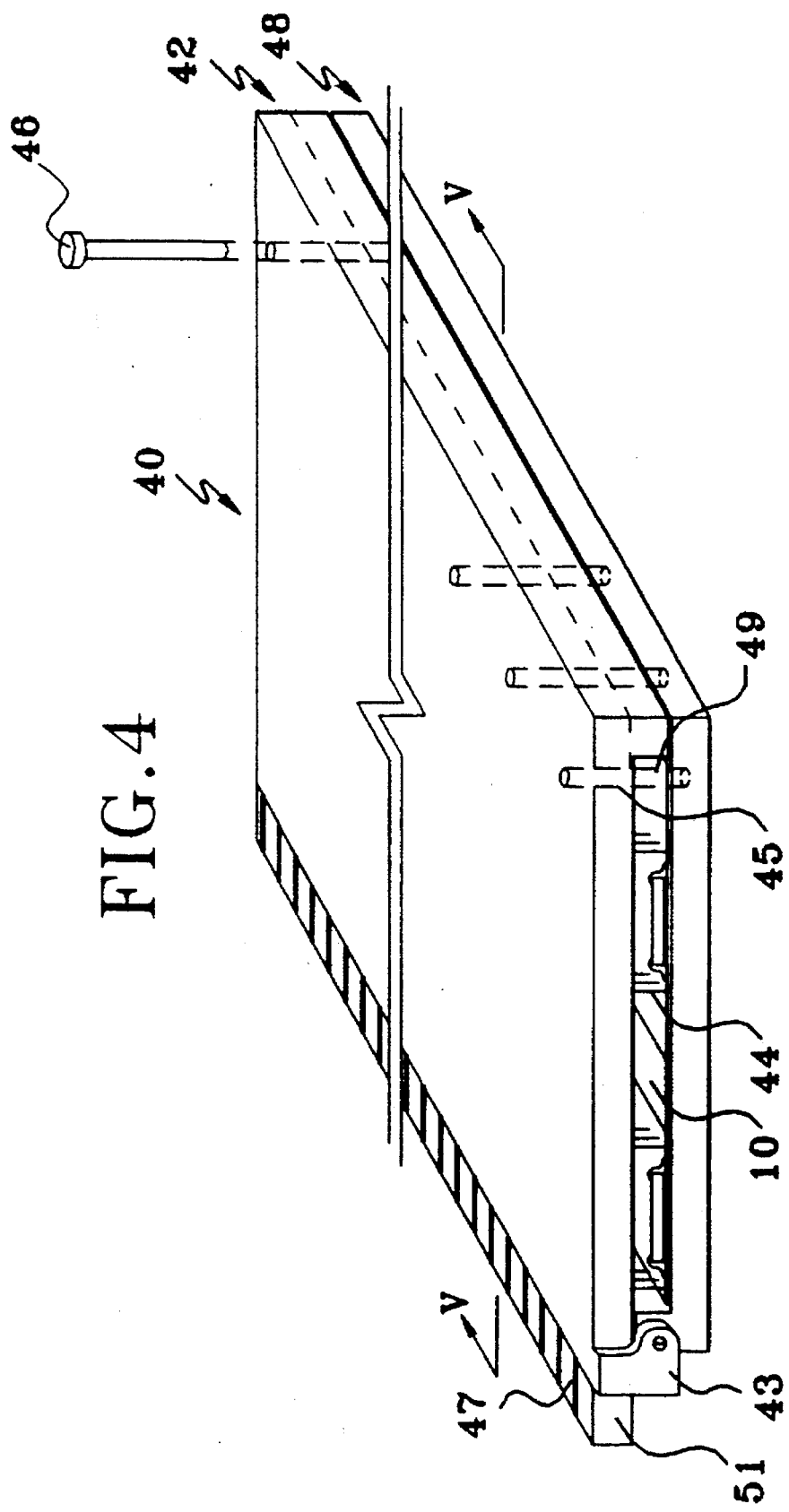
FIG. 4 is a perspective view of the test socket according to the present invention.

Hereinafter, a preferred structure and usage of the test socket able to accommodate the lead frame shown in FIG. 2 for producing the KGD array will be described in detail. Referring to FIG. 4 and FIG. 5, the test socket of the present invention consists of an upper socket 42 and an under socket 48 composed of ceramic or plastic materials. The edges of the upper and under sockets 42 and 48 are fixed to one another by a hinge 43 to be pivotably openable, and the opposite edges are fixed together by a clamp (not shown) when the test socket is closed. A plurality of input/output pads 47 are formed on surface of a plug portion 51 protruding from a side of the upper socket 42 in order to transfer the test signals between the test signal generator and targeted bare chips. A plurality of slot holes 45 formed in the upper socket 42 are aligned, when the test socket is closed, with the guiding holes 17 of the lead frame 10 (shown in FIG. 1 or FIG. 2) and with slot grooves 50 formed in the under socket 48. A plurality of pins 46 are inserted through the slot holes 45, the guiding holes 17 and the slot grooves 50 so that the lead frame 10 shown in FIG. 2 is positionally fixed within the closed test socket.

From the inner surface of the upper socket 42 a plurality of test probes 44 extend to contact the leads 14. Also, the test probes 44 are electrically connected through one or multi-leveled metal layers (not shown) to the input/output pads 47 on the plug portion 51 which is to be inserted into a test board (not shown). Alternative structural types of the test probes 44 may be possible, including a fogo style which includes a spring to flexibly support the test probe so as to move up and down in accordance with the pitch between the inner surface of the upper socket and the lead, and an isocon style in which a protruded contacting portion contacts the bonding pad 21 shown in FIG. 2.

In order to produce a plurality of KGDs, as shown in FIG. 2, the lead frame 10 is accommodated into the test socket and then the lead frame 10 including a plurality of bare chips 20 is fixed within the closed test socket by the pins 46 inserted through the slot holes 45, the guiding holes 17, and the slot grooves 50. For example, for an 1 Mb SRAM, the number of chips placed onto one lead frame is sixteen (corresponding to each of eight die pads on each of two columns). Also, when the test socket is closed, an edge of the side rail 16 is caught between the upper and under sockets 42 and 48 by means of the clamp (not shown). The test socket accommodating the lead frame is then inserted into the test board through the plug portion 51 including the input/output pads 47 for testing. The test board preferably receives a plurality of the test sockets. The formation of a complete KGD array after the test is as described above in accordance with FIG. 3.

According to the invention as aforementioned, since a series of tests is performed simultaneously to produce a plurality of KGDs, this test socket allows the testing cost as well as the manufacturing cost to be greatly reduced. Thus, the MCM or ASIC modules employing a plurality of KGDs may be produced at a low cost are and adaptable to personal computers as well as super computer systems. Further, the IC chips can be employed in personal computers as well as the MCM and ASIC modules due to the low cost for the KGD.

As the test socket is varied to an alternative one in accordance with structure, size, usage and standardization of the lead frame, the invention may be embodied in other specific forms without departing from the spirit or essential characteristics thereof. The present embodiment is therefore to be considered in all respects as illustrative and not restrictive, the scope of the invention being indicated by the appended claim rather than by the foregoing description and all changes which come within the meaning and range of equivalency of the claims are therefore intended to be embraced therein.

What is claimed is:

1. A die-testing apparatus comprising:

a lead frame having a plurality of die pads for receiving a plurality of dies, respectively, each said die pad being adjacent to a plurality of leads, said lead frame having a plurality of guide holes formed therethrough; and a test socket including:

an under socket portion having a plurality of slot grooves, said lead frame being mounted in said under socket portion; and an upper socket portion hingedly attached to said lower socket portion, said upper socket portion having a plurality of slot holes and a plurality of test probes extending downwardly from an inner surface of said upper socket portion, said upper socket portion having a plug portion extending from an edge thereof, said plug portion having a plurality of input/output connection pads formed thereon, said connection pads being electrically connected to said plurality of test probes.

2. A die-testing apparatus according to claim 1, further comprising a test board for generating test signals having at least one slot for receiving said plug portion, said slot having electrical connection sites for electrically connecting said input/output pads and said test board.

3. A die-testing apparatus according to claim 1, wherein one each of said guide holes, said slot grooves, and said slot holes are in alignment, said apparatus further including a plurality of guide pins, each said guide pin extending from one of said slot grooves through one of said guide holes and penetrating one of said slot holes to thereby positionally fix said lead frame relative to said test socket.

4. The apparatus according to claim 1, wherein said upper and under sockets are made of insulation materials.

5. The apparatus according to claim 1, wherein said test probe is a mechanical contact type probe.

6. The apparatus according to claim 5, wherein said test probe is one of a fogo type and an isocon type.

* * * * *